(12) United States Patent
Kim et al.

(10) Patent No.: US 8,084,318 B2
(45) Date of Patent: Dec. 27, 2011

(54) METHODS OF FABRICATING INTEGRATED CIRCUIT DEVICES INCLUDING STRAINED CHANNEL REGIONS AND RELATED DEVICES

(75) Inventors: Ki-chul Kim, Gyeonggi-do (KR); Ho Lee, Chungcheongnam-do (KR); Jung-deog Lee, Gyeonggi-do (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 12/763,654

(22) Filed: Apr. 20, 2010

(65) Prior Publication Data

US 2010/0203692 A1    Aug. 12, 2010

Related U.S. Application Data

(62) Division of application No. 11/862,452, filed on Sep. 27, 2007, now abandoned.

(30) Foreign Application Priority Data

Feb. 12, 2007    (KR) .................. 10-2007-0014562

(51) Int. Cl.
*H01L 21/8238*    (2006.01)

(52) U.S. Cl. ........ 438/218; 438/222; 438/285; 438/300; 257/E21.619; 257/E21.634

(58) Field of Classification Search .................. 438/218, 438/222, 300; 257/E21.619, E21.634
See application file for complete search history.

(56) References Cited

U.S. PATENT DOCUMENTS

| | | | |
|---|---|---|---|
| 5,847,419 A | 12/1998 | Imai et al. | |
| 6,541,343 B1 * | 4/2003 | Murthy et al. | ................ 438/299 |
| 6,563,151 B1 | 5/2003 | Shin et al. | |
| 6,633,066 B1 | 10/2003 | Bae et al. | |
| 6,680,224 B2 | 1/2004 | Shin et al. | |
| 6,900,102 B2 | 5/2005 | Lee et al. | |
| 6,914,301 B2 | 7/2005 | Bae et al. | |
| 6,940,129 B2 | 9/2005 | Kim et al. | |
| 7,002,207 B2 | 2/2006 | Kim et al. | |
| 7,026,688 B2 | 4/2006 | Kim et al. | |

(Continued)

FOREIGN PATENT DOCUMENTS

JP    2006-165480    6/2006

(Continued)

OTHER PUBLICATIONS

Notice to Submit Response corresponding to Korean Application No. 10-2007-0014562.

*Primary Examiner* — Michael Lebentritt
*Assistant Examiner* — Daniel Whalen
(74) *Attorney, Agent, or Firm* — Myers Bigel Sibley & Sajovec, P.A.

(57) ABSTRACT

A method of fabricating an integrated circuit device includes forming first and second gate patterns on surfaces of a semiconductor substrate in PMOS and NMOS regions, respectively, of the substrate. P-type source/drain regions are epitaxially grown on opposite sides of the first gate pattern in the PMOS region to exert compressive stress on a first channel region therebetween adjacent the first gate pattern. N-type source/drain regions are epitaxially grown on opposite sides of the second gate pattern in the NMOS region to exert tensile stress on a second channel region therebetween adjacent the second gate pattern. Related devices are also discussed.

17 Claims, 6 Drawing Sheets

| U.S. PATENT DOCUMENTS | | | | FOREIGN PATENT DOCUMENTS | | |
|---|---|---|---|---|---|---|
| 7,148,541 B2 | 12/2006 | Park et al. | | JP | 2006-196549 | 7/2006 |
| 7,195,987 B2 | 3/2007 | Bae et al. | | KR | 1020040049658 A | 6/2004 |
| 7,229,884 B2 | 6/2007 | Park | | KR | 1020060000276 A | 1/2006 |
| 2004/0253774 A1 | 12/2004 | Boyanov et al. | | WO | WO 2006/011939 A2 | 2/2006 |
| 2005/0082616 A1* | 4/2005 | Chen et al. | 257/350 | | | |
| 2006/0088968 A1* | 4/2006 | Shin et al. | 438/299 | | | |

* cited by examiner

METHODS OF FABRICATING INTEGRATED CIRCUIT DEVICES INCLUDING STRAINED CHANNEL REGIONS AND RELATED DEVICES

CLAIM OF PRIORITY

The present application is a divisional of and claims priority from U.S. patent application Ser. No. 11/862,452, filed Sep. 27, 2007, now abandoned which claims priority from Korean Patent Application No. 10-2007-0014562, filed on Feb. 12, 2007, in the Korean Intellectual Property Office, the disclosures of which are hereby incorporated by reference herein in their entireties.

FIELD

The present invention relates to integrated circuit devices and related fabrication methods.

BACKGROUND

As the degree of integration in integrated circuit devices has increased, the size of integrated circuit devices has decreased. Accordingly, the charge mobility of electrons and holes in channel regions of the devices may also be reduced. Various attempts have been made to address such problems; however, such processes may be relatively complicated and/or may involve relatively high manufacturing costs.

SUMMARY

Some embodiments of the present invention may provide integrated circuit devices with improved charge mobility in a channel region.

According to some embodiments of the present invention, an integrated circuit device includes a substrate including source/drain regions therein and a channel region therebetween. The source/drain regions include an epitaxially grown material configured form a heterojunction with the substrate. The source/drain regions are also configured to induce a net compressive strain or a net tensile strain on the channel region. The device further includes a gate pattern on a surface of the substrate between the source/drain regions and adjacent the channel region. For example, the substrate may be silicon, and the epitaxially grown material may be silicon germanium and/or germanium configured to induce the net compressive strain. In addition, the substrate may be silicon, and the epitaxially grown material may be silicon carbide configured to induce the net tensile strain.

According to other embodiments of the present invention, a complementary metal-oxide-semiconductor (CMOS) device includes a silicon substrate including a PMOS region and an NMOS region therein, and first and second gate patterns on surfaces of the substrate in the PMOS and NMOS regions, respectively. Silicon germanium source/drain regions on opposite sides of the first gate pattern in the PMOS region are configured to induce a net compressive strain on a first channel region in portions of the substrate therebetween. Silicon carbide source/drain regions on opposite sides of the second gate pattern in the NMOS region are configured to induce a net tensile strain on a second channel region in portions of the substrate therebetween.

According to further embodiments of the present invention, an integrated circuit device includes a semiconductor substrate including a PMOS region and an NMOS region therein. The device further includes first and second gate patterns on surfaces of the substrate in the PMOS and NMOS regions, respectively, p-type source/drain regions on opposite sides of the first gate pattern in the PMOS region, and n-type source/drain regions on opposite sides of the second gate pattern in the NMOS region. The p-type source/drain regions define a first channel region in portions of the substrate therebetween adjacent the first gate pattern. The p-type source/drain regions include a first epitaxially grown material configured to exert a net compressive stress on the first channel region. The n-type source/drain regions define a second channel region in portions of the substrate therebetween adjacent the second gate pattern. The n-type source/drain regions include a second epitaxially grown material configured to exert a net tensile stress on the second channel region.

In some embodiments, the semiconductor substrate may be silicon and the first material may be silicon germanium (SiGe) or germanium (Ge). In other embodiments, the substrate may be silicon and the second material may be silicon carbide (SiC).

In some embodiments, the semiconductor device may further include an insulating layer extending between portions of the p-type and/or n-type source/drain regions and the substrate. The insulating layer may be an oxide layer. The insulating layer may extend along sidewalls of the p-type and/or n-type source/drain regions to contact portions of the first and/or second channel regions. A surface of the insulating layer may be below that of the channel region. For example, the insulating layer may extend along the sidewalls of the p-type and/or n-type source/drain regions such that the portion of the first channel region extends between the insulating layer and the first gate pattern and/or such that the portion of the second channel region extends between the insulating layer and the second gate pattern.

In other embodiments, the semiconductor device may further include an isolation layer electrically separating the PMOS region and/or the NMOS region from an inactive region of the substrate. The insulating layer may extend along portions of the p-type and/or n-type source/drain region to contact the isolation layer.

In some embodiments, a depth of the source/drain regions may be less than a height of the first and/or second gate patterns.

According to other embodiments of the present invention, a method of manufacturing a semiconductor device includes forming first and second gate patterns on surfaces of a semiconductor substrate in PMOS and NMOS regions thereof, respectively. P-type source/drain regions are epitaxially grown on opposite sides of the first gate pattern in the PMOS region to exert a net compressive stress on a first channel region that includes a portion of the substrate therebetween adjacent the first gate pattern. N-type source/drain regions are epitaxially grown on opposite sides of the second gate pattern in the NMOS region to exert a net tensile stress on a second channel region that includes a portion of the substrate therebetween adjacent the second gate pattern.

In some embodiments, the p-type and n-type source/drain regions may be epitaxially grown by etching the semiconductor substrate using the first and second gate patterns as etching masks to define trenches therein adjacent the first and second gate patterns on the opposite sides thereof. A first material may be epitaxially grown in the trenches adjacent the first gate pattern to define the p-type source/drain regions. The first material may be configured to generate the net compressive stress on the first channel region. A second material may be epitaxially grown in the trenches adjacent the second gate pattern to define the n-type source/drain regions. The second material may be configured to generate the net tensile stress on the second channel region.

In other embodiments, prior to epitaxially growing the first and second materials, spacer patterns may be formed on sidewalls of the trenches extending adjacent to sidewalls of the first and second gate patterns. An insulating layer may be formed on surfaces of the trenches exposed by the spacer pattern, and the spacer patterns may be removed. The spacer patterns may be formed by depositing a nitride layer using a chemical vapor deposition (CVD) method. The spacer patterns may be removed by dipping the spacer patterns in a sulfur oxide solution, and dipping the spacer patterns in a solution of ammonia ($NH_4OH$), water ($H_2O$), and deionized water. The insulating layer may be an oxide layer pattern.

In some embodiments, the semiconductor substrate may include silicon, and the first material may include silicon germanium. In other embodiments, the semiconductor substrate may include silicon, and the first material may include germanium. In still other embodiments, the semiconductor substrate may include silicon, and the second material may include silicon carbide.

According to still other embodiments of the present invention a method of fabricating an integrated circuit device includes forming a gate pattern on a surface of a substrate. Source/drain regions are epitaxially grown on opposite sides of the gate pattern to form a heterojunction with the substrate and to induce a net compressive strain or a net tensile strain on a channel region therebetween that includes a portion of the substrate adjacent the gate pattern.

DETAILED DESCRIPTION OF EMBODIMENTS

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
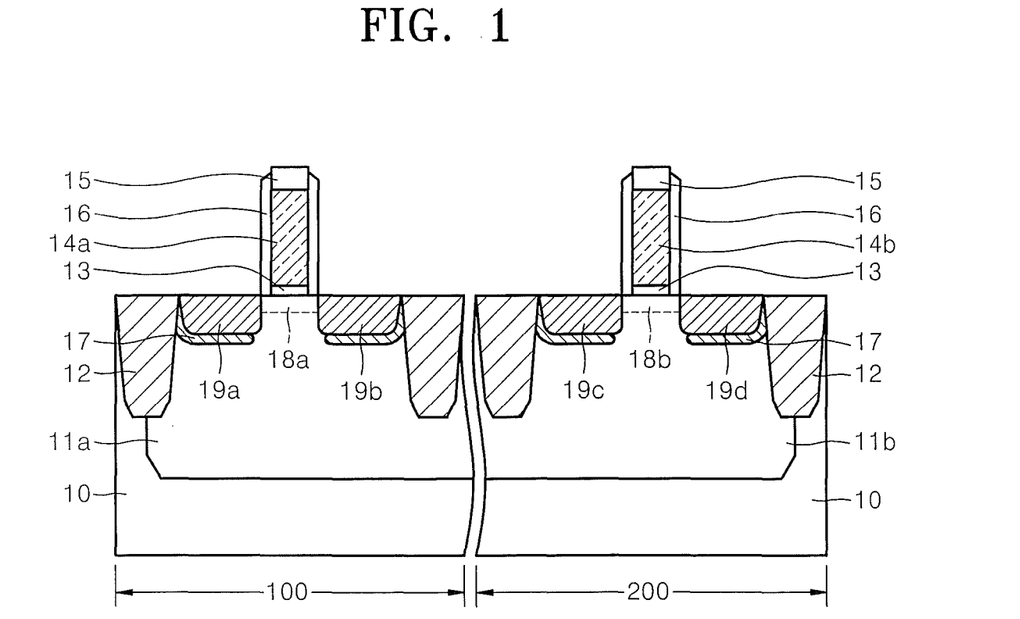
FIG. 1 is a cross-sectional view of a portion of an integrated circuit device according to some embodiments of the present invention.

FIG. 1 is a schematic view illustrating a portion of an integrated circuit device according to some embodiments of the present invention. Referring to FIG. 1, an integrated circuit device includes an n-type well (or n-well) 11a and a p-type well (or p-well) 11b on a substrate 10, such as a semiconductor substrate. The n-well 11a and the p-well 11b may each have an isolation region isolated from peripheral regions, such as an inactive region isolated by an isolation layer 12 having a shallow trench isolation (STI). The isolation region may be a PMOS region 100 where a PMOSFET is formed and an NMOS region 200 where an NMOSFET is formed. The isolation layer 12 may be formed of an oxide layer including silicon. As such, the integrated circuit device may be a complementary metal-oxide-semiconductor (CMOS) device.

In the PMOS region 100, trenches in which a p-type source region 19a and a p-type drain region 19b are to be formed are separated from each other in the n-well 11a. The trenches have bottom sides/surfaces and lateral sides/sidewalls. The depth of the trenches may be less than the height of a gate pattern (as further described in detail below), and in particular, less than the height of a gate oxide layer 13 and a gate electrode 14a. Portions of the trenches may contact portions of the isolation layer 12. A first insulating layer 17 extends along the bottom sides/surfaces of the trenches. The first insulating layer 17 may be formed of an oxide layer, such as a thermal oxide layer. The first insulating layer 17 may extend from the bottom surfaces of the trenches to the sidewalls of the trenches, which may contact sides of the isolation layer 12. Though not illustrated in the drawings, the first insulating layer 17 may extend from the bottom surfaces of the trenches onto portions of the sidewalls of the trenches to be adjacent to and/or contact a channel region 18a. However, the adjacent surface of the first insulating layer 17 may be below the channel region 18a.

The trenches on the first insulating layer 17 are at least partially filled with an epitaxially grown material in order to define a source region 19a and a drain region 19b. A top/upper surface of the epitaxially grown material may be substantially flush with a surface of the substrate 10, or may be formed to a height that is relatively greater than the surface of the substrate 10. The channel region 18a is defined between the source region 19a and the drain region 19b, and may not be isolated from the substrate 10. Since the channel region 18a is not isolated from the substrate 10, self-heating effects and/or floating body effects can be reduced and/or prevented. Also, due to the first insulating layer 17, junction capacitance and/or leakage current of the source and drain regions 19a and 19b can be reduced.

Still referring to FIG. 1, a gate pattern is formed on the channel region 18a. For example, the gate pattern may be formed by sequentially stacking a gate oxide layer 13, a gate electrode 14a, and a hard mask layer 15. The gate oxide layer 13 may include silicon. The gate electrode 14a may include polysilicon and/or metal, such as tungsten. The hard mask layer 15 may be formed of a material having etching selectivity to silicon. A gate spacer pattern 16 may be formed on sides of the gate oxide layer 13, the gate electrode 14a, and the hard mask layer 15. The gate spacer pattern 16 may be formed of a nitride layer, for example, a silicon nitride layer ($Si_3N_4$).

The epitaxially grown material defining the source region 19a and the drain region 19b in the PMOS region 100 may be a first material configured to apply or induce or exert a net compressive stress (also referred to herein as compressive strain) on the channel region 18a. When a net compressive stress is applied to the channel region 18a, the mobility of charge carriers of the channel region 18a in the PMOS region 100 can be improved. For example, where the substrate 10 includes silicon, the epitaxial growth material forming the source region 19a and the drain region 19b, that is, the first material, may include silicon germanium (SiGe) and/or germanium (Ge). As such, the epitaxially grown material defining the source region 19a and the drain region 19b may form a heterojunction with the substrate 10 in the PMOS region 100.

In the NMOS region 200, trenches in which an n-type source region 19c and an n-type drain region 19d are to be formed are separated from each other in the p-well 11b. The trenches have bottom sides/surfaces and lateral sides/sidewalls. The depth of the trenches is less than the height of a gate pattern (as further described in detail below), and in particular, less than the height of a gate oxide layer 13 and a gate electrode 14b. Portions of the trenches may contact portions of the isolation layer 12. A first insulating layer 17 extends along the bottom surfaces of the trenches.

The trenches on the first insulating layer 17 are at least partially filled with an epitaxially grown material in order to define a source region 19c and a drain region 19d. A top/upper surface of the epitaxially grown material may be substantially flush with a surface of the substrate, or may be formed to a height that is relatively higher than the surface of the substrate 10. The channel region 18b is formed between the source region 19c and the drain region 19d, and may not be isolated from the substrate 10. Since the channel region 18b is not isolated from the substrate 10, self-heating effects and/or floating body effects can be reduced and/or prevented. Also, due to the first insulating layer 17, junction capacitance and/or leakage current of the source and drain regions 19c and 19d can be reduced.

A gate pattern is formed on the channel region 18b. For example, the gate pattern may be formed by sequentially stacking a gate oxide layer 13, a gate electrode 14b, and a hard mask layer 15. The gate oxide layer 13 may include silicon. The gate electrode 14b may include polysilicon and/or or metal, such as tungsten. The hard mask layer 15 may be formed of a material having etching selectivity to silicon. A gate spacer pattern 16 may be formed on sides of the gate oxide layer 13, the gate electrode 14b, and the hard mask layer 15. The gate spacer pattern 16 may be formed of a nitride layer, for example, a silicon nitride layer ($Si_3N_4$).

The epitaxially grown material defining the source region 19c and the drain region 19d in the NMOS region 200 may be a second material configured to apply or induce or exert a net tensile stress (also referred to herein as tensile strain) on the channel region 18b. When a net tensile stress is applied to the channel region 18b, the mobility of charge carriers of the channel region 18b in the NMOS region 200 can be improved. For example, where the substrate 10 includes silicon, the epitaxially grown material forming the source region 19c and the drain region 19d, that is, the second material, may include silicon carbide (SiC). As such, the epitaxially grown material defining the source region 19c and the drain region 19d may form a heterojunction with the substrate 10 in the NMOS region 200.

FIGS. 2 through 11 are cross-sectional views illustrating methods of manufacturing integrated circuit devices according to some embodiments of the present invention.

Figure 2:
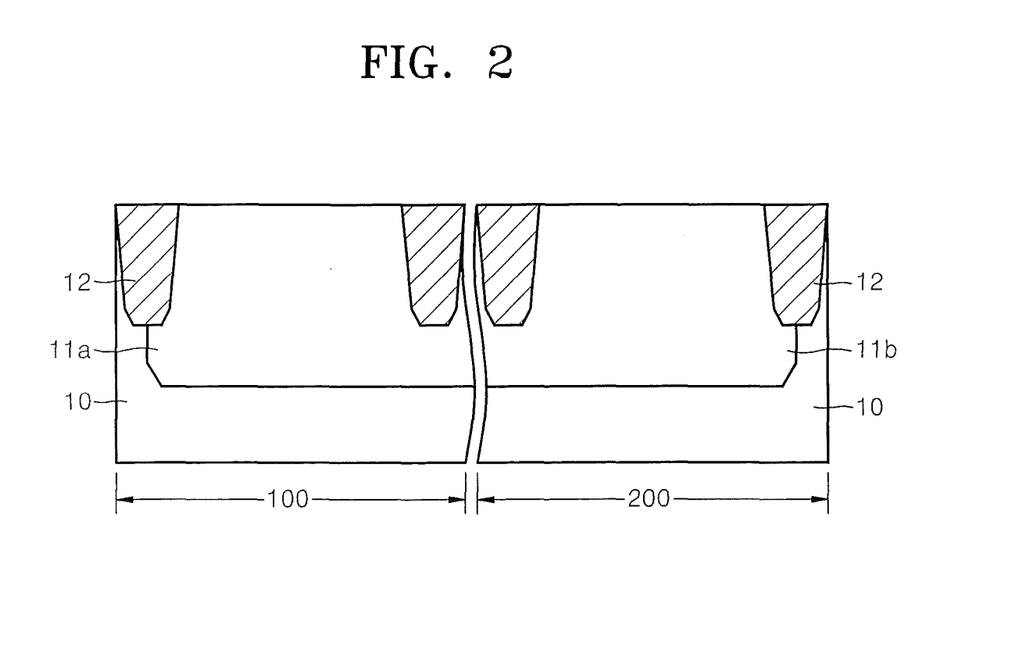
FIGS. 2 through 11 are cross-sectional views illustrating methods of fabricating integrated circuit devices according to some embodiments of the present invention.

Referring to FIG. 2, a substrate 10, such as a semiconductor substrate in which a PMOS region 100 and an NMOS region 200 may be defined, is provided. An n-well 11a is formed in the PMOS region 100, and a p-well 11b is formed in the NMOS region 200. An isolation layer 12 may be formed to isolate the n-well 11a and the p-well 11b from peripheral regions, such as an inactive region. The isolation layer 12 may be an insulating layer pattern, such as a shallow trench isolation (STI) pattern.

Figure 3:
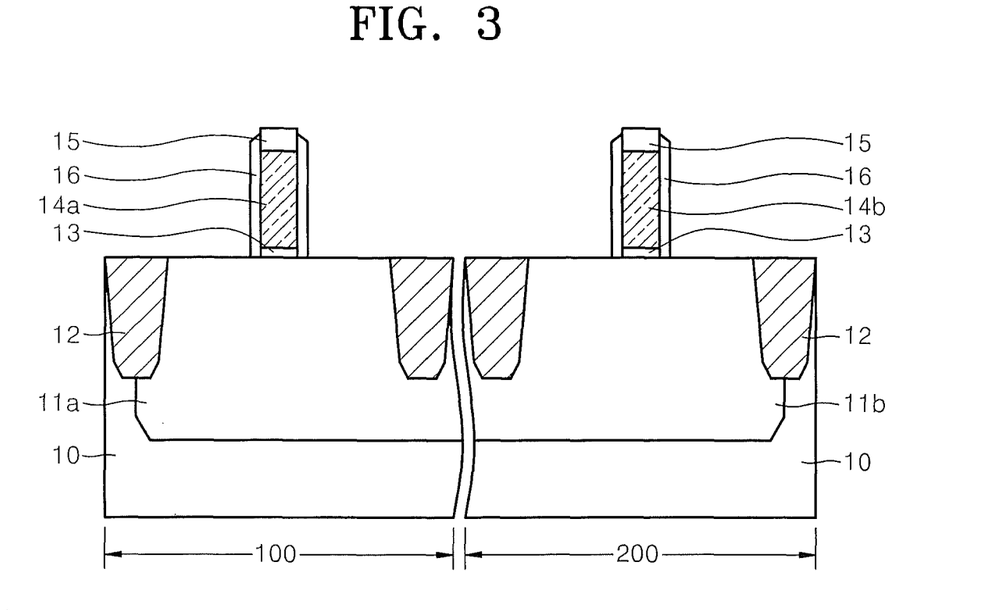

Referring to FIG. 3, a gate pattern is formed on the substrate 10 in each of the PMOS region 100 and the NMOS region 200. The gate pattern may include a gate oxide layer 13, a gate electrode 14a or 14b, and a hard mask layer 15. The gate electrode 14a formed on the PMOS region 100 and the gate electrode 14b formed on the NMOS region 200 may be doped with different types of impurities at different concentrations/densities. The gate pattern may further include a gate spacer pattern 16 on sides of the gate oxide layer 13, the gate electrode 14a or 14b, and the hard mask layer 15.

Figure 4:
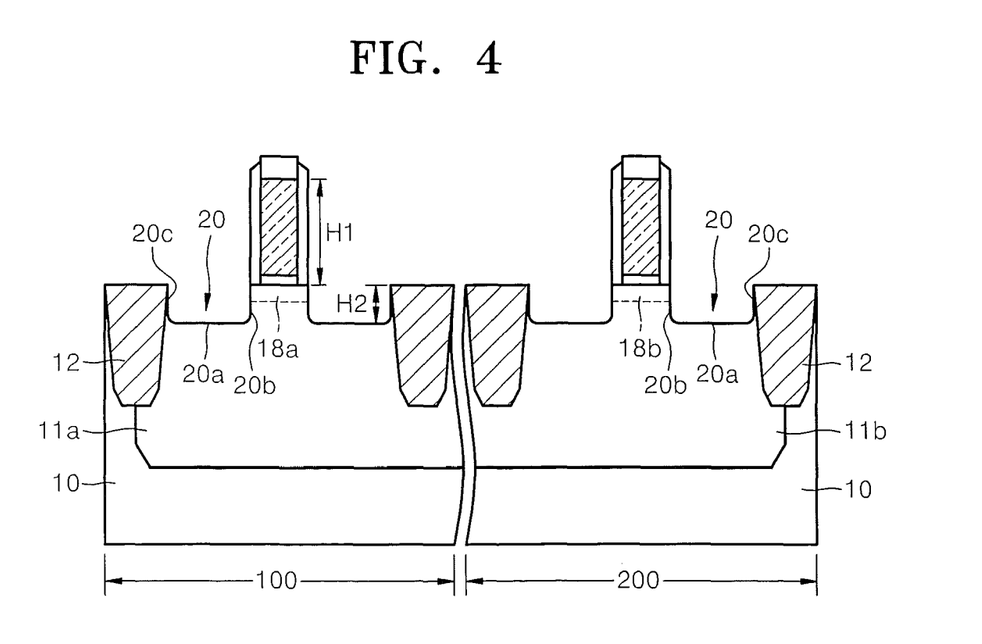

Referring to FIG. 4, the substrate 10 is etched using the gate pattern as an etching mask to form trenches 20. For example, where the substrate 10 includes silicon, the substrate 10 can be etched using an etching gas including a combination of $O_2$, $CF_4$ and/or $Cl_2$. Thus, channel regions 18a and 18b are defined in a portion of the substrate 10 below the gate patterns. The channel regions 18a and 18b may be formed prior to forming the gate pattern, for example, using an ion implantation process. The trenches 20 have bottom surfaces 20a between first and second sidewalls 20c and 20b. The first sidewall 20c contacts the isolation layer 12, and the second sidewall 20b extends from the side of the gate pattern. That is, the second sidewall 20b may contact the channel regions 18a and 18b. The trenches 20 may be formed to have a depth H2 that is less than the height of the gate pattern, and in particular, less than a height H1 of the gate oxide layer 13 and the gate electrode 14a or 14b. The trenches 20 may be formed to be deeper than the channel regions 18a and 18b.

Figure 5:
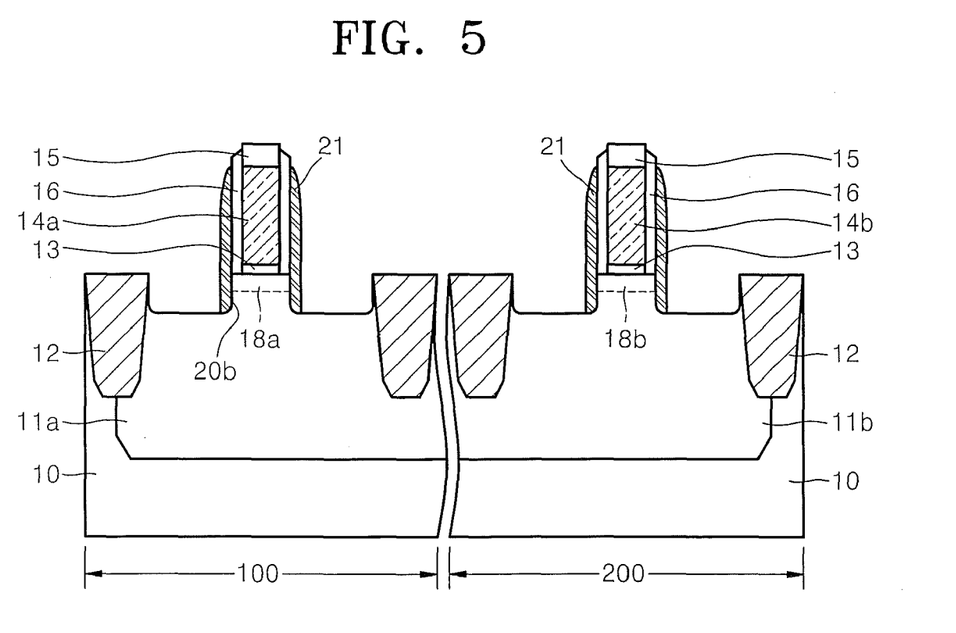

Referring to FIG. 5, a spacer pattern 21 is formed on the sides of the gate pattern and the second lateral side 20b of the trenches 20. The spacer pattern 21 may be formed of a nitride layer. For example, the spacer pattern 21 may be formed by depositing a silicon nitride ($Si_3N_4$) layer at about 700 to 800 degrees Celsius using $NH_3$ and $N_2$ gases by a chemical vapor deposition (CVD) process, and etching portions of the deposited silicon nitride layer. The spacer pattern 21 may be formed to substantially cover the second sidewalls 20b of the trenches 20, and as such, to cover the channel regions 18a and 18b.

Figure 6:
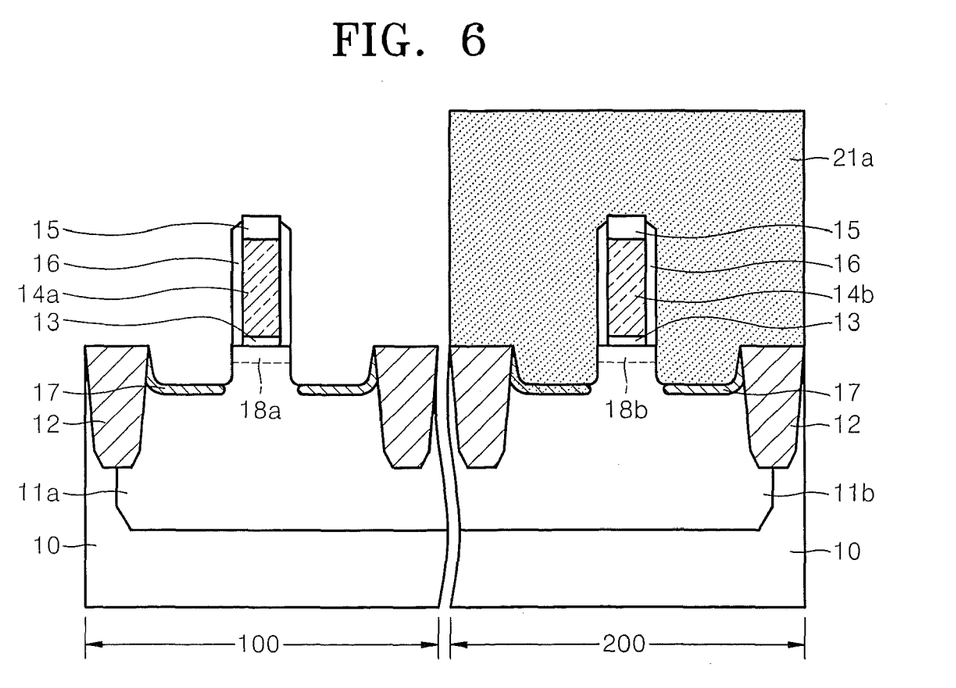

Referring to FIG. 6, a first insulating layer 17 is formed on surfaces of the trenches 20 exposed by the spacer pattern 21. The first insulating layer 17 may be an oxide layer, such as a thermal oxide layer. For example, a thermal oxide layer may be formed using oxygen gas at a temperature in the range of about 1050 to 1100 degrees Celsius at an atmospheric pressure. The surfaces of the trenches 20 exposed by the spacer pattern 21 include a bottom surface of the trenches 20 exposed by the spacer pattern 21 (20a of FIG. 4) and a first sidewall of the trenches 20 (20c of FIG. 4). When the spacer pattern 21 exposes a portion of a second sidewall of the trenches 20 (20b of FIG. 4), the first insulating layer 17 may also be formed on a portion of the second sidewall of the trench 20 exposed by the spacer pattern 21. However, a top/upper surface of the first insulating layer 17 may be formed to extend below the channel regions 18a and 18b, for example, such that portions of the channel regions 18a and 18b are between the first insulating layer 17 and the gate patterns.

Still referring to FIG. 6, the spacer pattern 21 is removed. The spacer pattern 21 may be removed using a wet etching method. For example, the spacer pattern 21 may be removed by dipping the spacer pattern 21 in a sulfur solution ($H_2SO_4$) at about 120 degrees Celsius, and dipping the spacer pattern 21 in a solution mixed with ammonia ($NH_4OH$), water ($H_2O$), and deionized water at about 25 degrees Celsius (C). After removing the spacer pattern 21, the integrated circuit device can be cleaned by dipping in the mixed solution of ammonia ($NH_4OH$), water ($H_2O$), and deionized water, and in HCl. A first photoresist pattern 21a is selectively formed on a first region. The first region on which the first photoresist pattern 21a is formed may be one of the PMOS region 100 and the NMOS region 200. In FIG. 6, the NMOS region 200 is selected as the first region; however, in other embodiments, the PMOS region 100 may be selected as the first region on which the first photoresist pattern 21a is formed.

Figure 7:
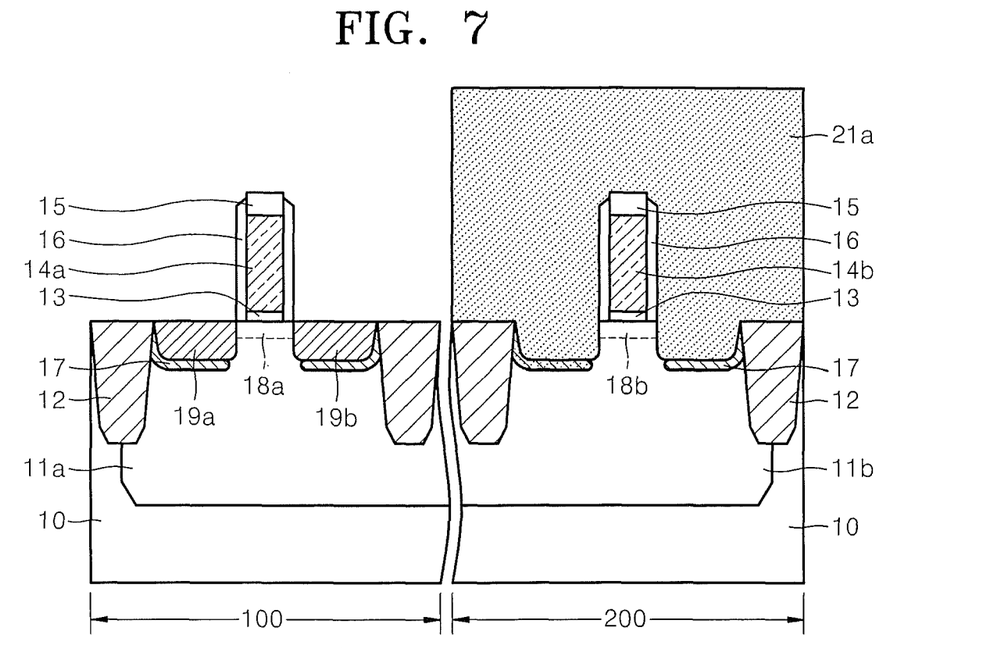

Referring to FIG. 7, a first material is epitaxially grown in the trenches 20 formed in the PMOS region 100 to form a p-type source region 19a and a p-type drain region 19b. When the substrate 10 includes silicon, the first material may include silicon germanium (SiGe) and/or germanium (Ge). As such, the first material may form a heterojunction with the substrate 10. In order to epitaxially grow the first material, the trenches 20 may be pre-treated using an HF solution, and may be baked at a temperature in the range of about 700 to 1000 degrees Celsius. When the first material is silicon germanium, the first material may be epitaxially grown by supplying $GeH_4$ and $Si_2H_6$ gas at a temperature of about 550 to 900 degrees Celsius. In some embodiments, $GeH_4$ can be replaced with $GeCl_4$, and $Si_2H_6$ can be replaced with $SiH_4$, $SiH_2Cl_2$, or $Si_3H_8$. When the first material is germanium, the first material may be epitaxially grown by supplying $GeH_4$ gas at a temperature in the range of about 350 to 700 degrees Celsius. Also, the first epitaxially grown material can be grown laterally on portions of the second sidewalls (20b of FIG. 4) of the trenches 20 exposed by the first insulating layer 17. After the first material is epitaxially grown, portions of the first material can be planarized by chemical mechanical polishing (CMP) and/or etching.

Figure 8:
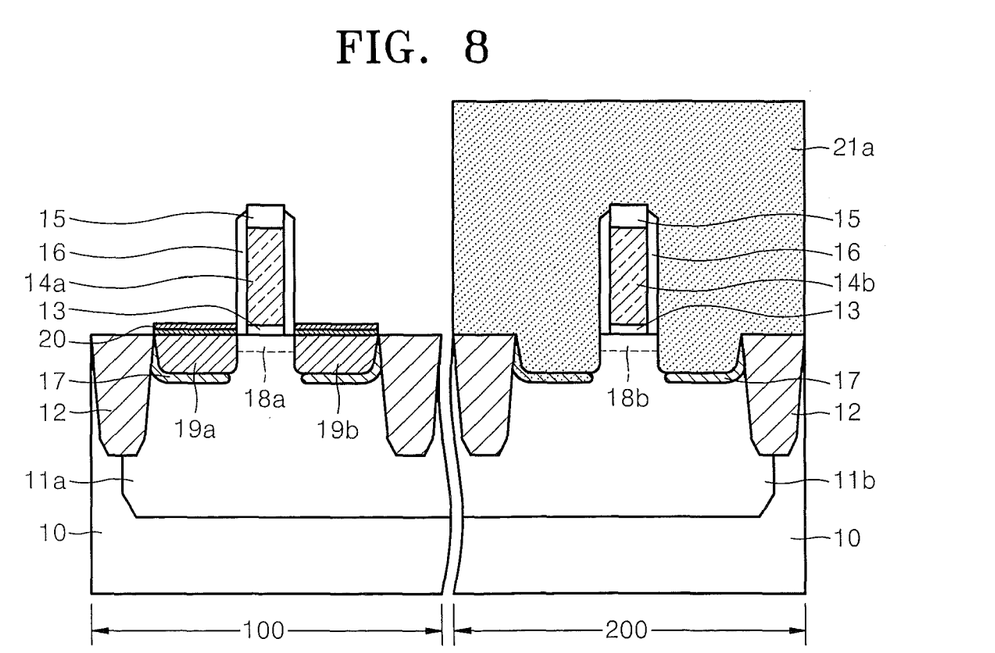

Referring to FIG. 8, a protection layer pattern 20 is formed on the epitaxially grown material formed in the PMOS region 100. The protection layer pattern 20 may be formed by sequentially stacking a silicon layer pattern and an oxide layer pattern. The protection layer pattern 20 may function as a capping layer in a subsequent process in order to protect the epitaxially grown material (i.e., the first material) previously formed in the PMOS region 100.

Figure 9:
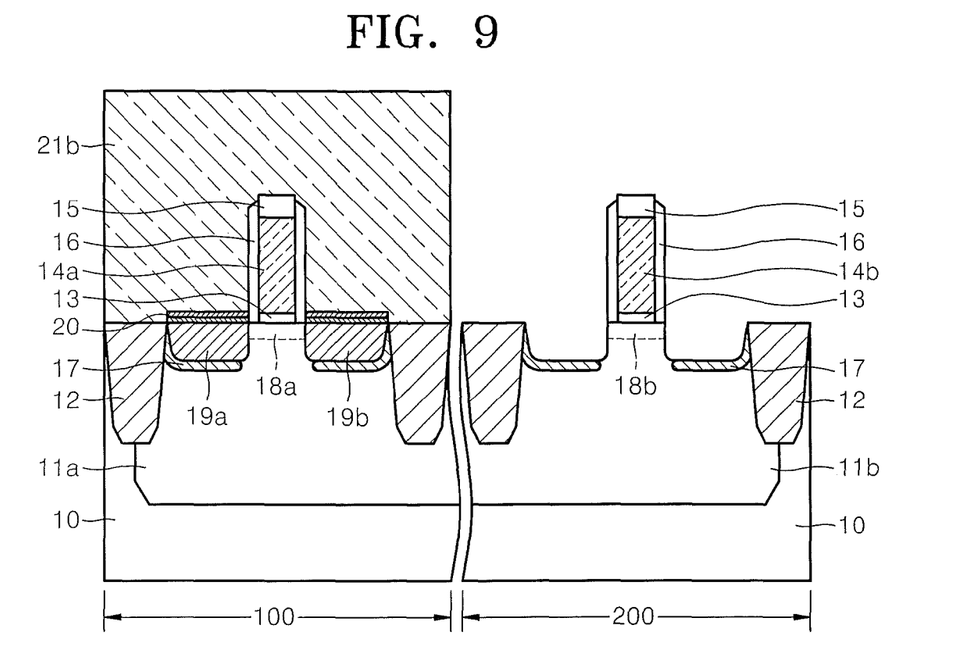

Referring to FIG. 9. the first photoresist pattern (21a of FIG. 8) formed in the NMOS region 200 is removed, and a second photoresist pattern 21b is selectively formed on the PMOS region 100. As the first photoresist pattern 21a is removed, the second sidewall (20b of FIG. 4) of the trenches formed in the NMOS region 200 is exposed.

Figure 10:
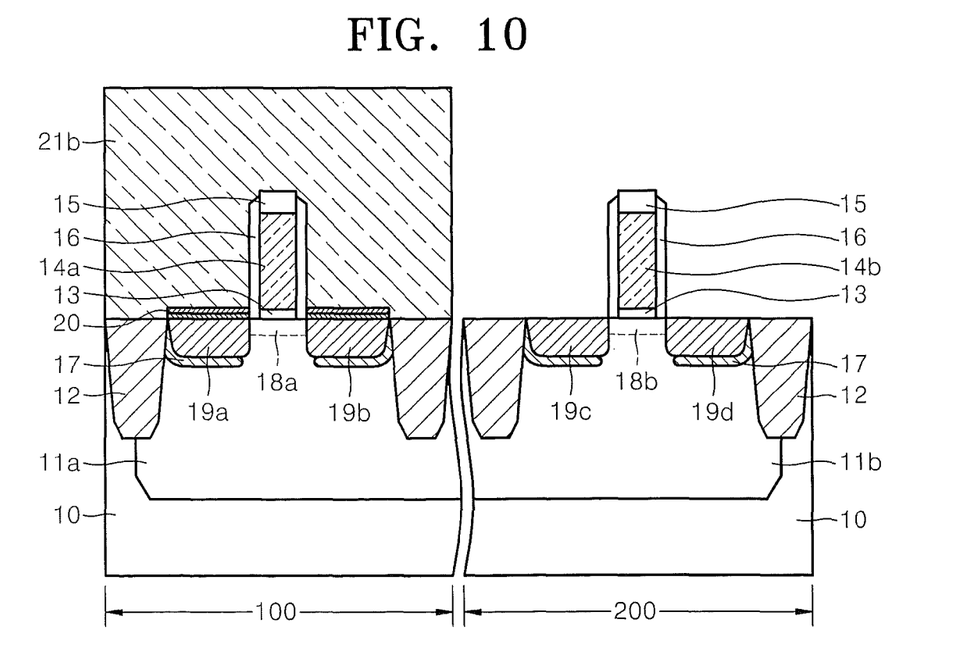

Referring to FIG. 10, the second material is epitaxially grown in the trenches 20 (in FIG. 4) formed in the NMOS region 200 to form an n-type source region 19c and an n-type drain region 19d. When the substrate 10 includes silicon, the second material may include silicon carbide (SiC). As such, the second material may also form a heterojunction with the substrate 10. In order to epitaxially grow the second material, the trenches 20 may be preferably pre-treated with an HF solution. The trenches 20 may be baked at a temperature in the range of about 700 to 1000 degrees Celsius. When the second material is silicon carbide, the second material can be epitaxially grown by supplying $SiH_3CH_3$ and $CH_4$ gas at a temperature in the range of about 500 to 650 degrees Celsius. $CH_4$ may be replaced with $C_2H_6$. The epitaxially grown second material may be grown laterally on portions of the second sidewalls (20b in FIG. 4) of the trenches 20 exposed by a first insulating layer 17. After the second material is epitaxially grown, the second material may be planarized by CMP and/or etching.

Figure 11:
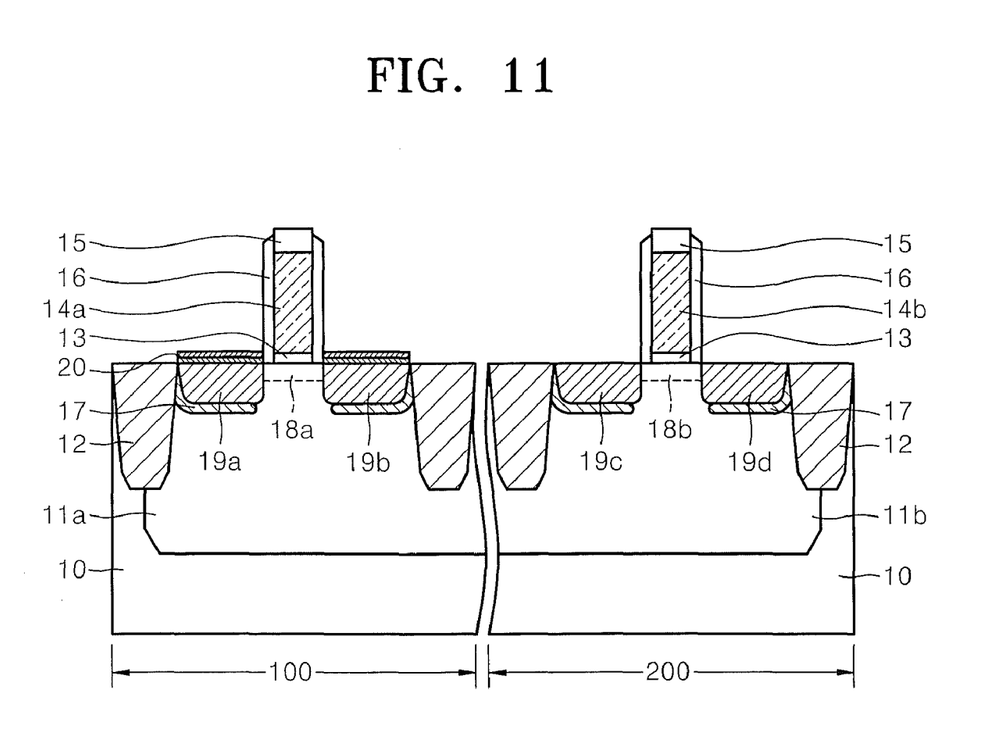

Referring to FIG. 11, the second photoresist pattern 21b formed on the PMOS region 100 is removed to define an integrated circuit device according to the song embodiments of the present invention. The protection layer pattern 20 can be removed or and/or after removing the second photoresist pattern 21b. Referring to FIGS. 5 and 6, according to the some embodiments of the present invention, the spacer pattern 21 may be removed in the PMOS region 100 and the NMOS region 200 at a substantially same time, and the first photoresist pattern 21a may be formed on the NMOS region 200. However, according to other embodiments of the present invention, the first photoresist pattern 21a may be formed on the NMOS region 200 before removing the spacer pattern 21 on the NMOS region 200, and then the spacer pattern 21 on the PMOS region 100 may be selectively removed. The spacer pattern 21 can protect sidewalls of the trenches 20 on the NMOS region 200 when forming an epitaxially grown material (i.e., the first material) in the source/drain regions of the PMOS region 100. The spacer pattern on the NMOS region 200 can be removed after removing the first photoresist pattern 21a, and the second photoresist pattern 21b can be formed on the PMOS region 100.

While the present invention has been particularly shown and described with reference to exemplary embodiments thereof, the exemplary embodiments should be considered in a descriptive sense only and not for purposes of limitation. For example, it will be understood by those skilled in the art that although the PMOS region 100 and the NMOS region 200 are separated from each other in FIG. 1, the present invention is not limited thereto, and as such, the PMOS region 100 and the NMOS region 200 may be directly adjacent to each other and/or may contact each other in some embodiments.

Thus, in integrated circuit devices and methods of fabricating the same according to some embodiments of the present invention, the mobility of charge carriers in the channel region can be improved using a relatively simple and inexpensive process.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method of fabricating an integrated circuit device, the method comprising:
   forming first and second gate patterns on surfaces of a semiconductor substrate in PMOS and NMOS regions thereof, respectively;
   etching the semiconductor substrate using the first and second gate patterns as etching masks to define trenches therein adjacent the first and second gate patterns on opposite sides thereof;
   forming spacer patterns on sidewalls of the trenches extending adjacent to sidewalls of the first and second gate patterns;
   forming an insulating layer on surfaces of the trenches exposed by the spacer patterns;
   removing the spacer patterns; and then
   epitaxially growing p-type source/drain regions in the trenches on the opposite sides of the first gate pattern in the PMOS region to exert a net compressive stress on a first channel region comprising a portion of the substrate therebetween adjacent the first gate pattern; and
   epitaxially growing n-type source/drain regions in the trenches on the opposite sides of the second gate pattern in the NMOS region to exert a net tensile stress on a second channel region comprising a portion of the substrate therebetween adjacent the second gate pattern.

2. The method of claim 1, wherein epitaxially growing the p-type and n-type source/drain regions comprises:
   epitaxially growing a first material in the trenches adjacent the first gate pattern to define the p-type source/drain regions, the first material being configured to generate the net compressive stress on the first channel region; and
   epitaxially growing a second material in the trenches adjacent the second gate pattern to define the n-type source/drain regions, the second material being configured to generate the net tensile stress on the second channel region.

3. The method of claim 2, wherein the semiconductor substrate comprises silicon, and wherein epitaxially growing the first material comprises epitaxially growing silicon germanium (SiGe) and/or germanium (Ge).

4. The method of claim 2, wherein the semiconductor substrate comprises silicon, and wherein epitaxially growing the second material comprises epitaxially growing silicon carbide (SiC).

5. The method of claim 2, wherein etching the semiconductor substrate comprises:
   etching the substrate to define the trenches therein having a depth that is less than a height of the first and/or second gate patterns.

6. The method of claim 1, wherein the forming the spacer patterns comprises:
   depositing a nitride layer on the sidewalls of the trenches using a chemical vapor deposition (CVD) process.

7. The method of claim 1, wherein the forming the insulating layer comprises:
   oxidizing the exposed surfaces of the trenches.

8. The method of claim 1, wherein the removing the spacer patterns comprises:
   dipping the spacer patterns in a sulfur oxide solution; and
   dipping the spacer patterns in a solution comprising ammonia ($NH_4OH$), water ($H_2O$), and/or deionized water.

9. The method of claim 1, wherein epitaxially growing the p-type and n-type source/drain regions comprises:
   selectively forming a first photoresist pattern on one of the PMOS region and the NMOS region; and then
   epitaxially growing one of the p-type and the n-type source/drain regions on a corresponding one of the PMOS and NMOS regions that does not include the first photoresist pattern thereon.

10. The method of claim 9, further comprising:
    forming a protection layer pattern on the epitaxially grown one of the p-type and n-type source/drain regions;
    removing the first photoresist pattern;
    selectively forming a second photoresist pattern on the corresponding one of the PMOS and NMOS regions including the one of the p-type and n-type source/drain regions;
    epitaxially growing another one of the p-type and n-type source/drain regions on a corresponding one of the PMOS and NMOS regions that does not include the second photoresist pattern thereon; and
    removing the second photoresist pattern.

11. The method of claim 10, wherein the forming the protection layer pattern comprises:
    forming a silicon layer pattern; and
    forming an oxide layer pattern on the silicon layer pattern.

12. A method of fabricating an integrated circuit device, the method comprising:
  forming a gate pattern on a surface of a substrate;
  etching the substrate using the gate pattern as an etching mask to define trenches therein on opposite sides of the gate pattern;
  forming insulating layers on bottom surfaces of the trenches; and
  epitaxially growing source/drain regions from sidewalls of the trenches exposed by the insulating layers to form a heterojunction with the substrate and to induce a net compressive strain or a net tensile strain on a channel region therebetween comprising a portion of the substrate adjacent the gate pattern,
  wherein forming the insulating layers on the bottom surfaces of the trenches comprises:
    forming spacer patterns on the sidewalls of trenches extending adjacent to sidewalls of the gate pattern;
    forming the insulating layers on the bottom surfaces of the trenches exposed by the spacer patterns; and then
    removing the spacer patterns to expose the sidewalls of the trenches prior to epitaxially growing the source/drain regions.

13. The method of claim 12, wherein epitaxially growing the source/drain regions comprises:
  epitaxially growing a material in the trenches adjacent the first gate pattern to define the source/drain regions, the material being configured to generate the net compressive strain or the net tensile strain on the channel region.

14. The method of claim 13, wherein the substrate comprises silicon, and wherein the epitaxially grown material comprises silicon germanium and/or germanium configured to induce the net compressive strain.

15. The method of claim 13, wherein the substrate comprises silicon, and wherein the epitaxially grown material comprises silicon carbide configured to induce the net tensile strain.

16. The method of claim 12, wherein the insulating layers laterally extend between the epitaxially grown source/drain regions and the bottom surfaces of the trenches.

17. A method of fabricating an integrated circuit device, the method comprising:
  forming first and second gate patterns on surfaces of a semiconductor substrate in PMOS and NMOS regions thereof, respectively;
  forming spacer patterns on sidewalls of trenches extending adjacent to sidewalls of the first and second gate patterns;
  forming an insulating layer on surfaces of the trenches exposed by the spacer patterns;
  removing the spacer patterns; and then
  epitaxially growing p-type source/drain regions on opposite sides of the first gate pattern in the PMOS region to exert a net compressive stress on a first channel region comprising a portion of the substrate therebetween adjacent the first gate pattern; and
  epitaxially growing n-type source/drain regions on opposite sides of the second gate pattern in the NMOS region to exert a net tensile stress on a second channel region comprising a portion of the substrate therebetween adjacent the second gate pattern,
  wherein the epitaxially grown p-type source/drain regions and the epitaxially grown n-type source/drain regions are grown laterally, and
  wherein the insulating layer extends directly on bottom portions of the source/drain regions between edges of the source/drain regions and the substrate.

* * * * *